(12) United States Patent
Kosaka

(10) Patent No.: US 11,821,933 B2
(45) Date of Patent: Nov. 21, 2023

(54) INSULATION TESTING APPARATUS AND METHOD OF THE SAME

(71) Applicant: DENSO CORPORATION, Kariya (JP)

(72) Inventor: Yuki Kosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 438 days.

(21) Appl. No.: 16/839,212

(22) Filed: Apr. 3, 2020

(65) Prior Publication Data
US 2020/0319242 A1 Oct. 8, 2020

(30) Foreign Application Priority Data

Apr. 3, 2019 (JP) .................................. 2019-071458
Mar. 26, 2020 (JP) .................................. 2020-056075

(51) Int. Cl.
*G01R 31/12* (2020.01)
*G01R 31/16* (2006.01)

(52) U.S. Cl.
CPC ......... *G01R 31/1272* (2013.01); *G01R 31/16* (2013.01)

(58) Field of Classification Search
CPC ............................ G01R 31/1272; G01R 31/16
See application file for complete search history.

(56) References Cited

U.S. PATENT DOCUMENTS

| 6,452,416 | B1 * | 9/2002 | Kaneda | G01R 31/1263 |
| | | | | 219/69.18 |
| 2006/0022679 | A1 * | 2/2006 | Obata | H02K 15/105 |
| | | | | 324/551 |
| 2006/0158197 | A1 * | 7/2006 | Horikoshi | G01R 31/343 |
| | | | | 324/551 |
| 2014/0062525 | A1 * | 3/2014 | Obata | G01R 31/346 |
| | | | | 324/765.01 |
| 2015/0247901 | A1 * | 9/2015 | Okada | G01R 31/343 |
| | | | | 324/765.01 |

FOREIGN PATENT DOCUMENTS

| JP | 2005-257549 A | 9/2005 |
| JP | 2015-075470 A | 4/2015 |

* cited by examiner

*Primary Examiner* — Jeff W Natalini
(74) *Attorney, Agent, or Firm* — Oliff PLC

(57) ABSTRACT

An insulation testing apparatus includes: a power unit having a first and second terminals; a switching unit switching between an electrical connected and disconnected states between the wire rods of respective phases and the core, and the first and second terminals; a discharge measurement unit measuring an amount of discharge produced between a first and second members electrically connected to the first and the second terminal, respectively; an insulation determination unit determines, based on the amount of discharge, whether the coating of the wire rods satisfies a predetermined quality regulation; and a control unit controlling the switching unit such that all of the wire rods and the core are electrically connected to the first or second terminals, while controlling the switching unit such that none of the wire rods nor the core is insulated with both of the first and second terminals.

7 Claims, 6 Drawing Sheets

FIG.4

|  | FIRST COMPARATIVE EXAMPLE | | FIRST EMBODIMENT | |
|---|---|---|---|---|
|  | MEASUREMENT PORTION | NON-MEASUREMENT PORTION | MEASUREMENT PORTION | NON-MEASUREMENT PORTION |
| FIRST | U-V | W CORE | U-VW CORE | — |
| SECOND | V-W | U CORE | V-WU CORE | — |
| THIRD | W-U | V CORE | UVW-CORE | — |
| FOURTH | UVW-CORE | — | | |

FIG.5

|  | FIRST COMPARATIVE EXAMPLE | | SECOND EMBODIMENT | |
|---|---|---|---|---|
|  | MEASUREMENT PORTION | NON-MEASUREMENT PORTION | MEASUREMENT PORTION | NON-MEASUREMENT PORTION |
| FIRST | U-V | W CORE | VW-U CORE | — |
| SECOND | V-W | U CORE | WU-V CORE | — |
| THIRD | W-U | V CORE | | |
| FOURTH | UVW-CORE | — | | |

FIG.6

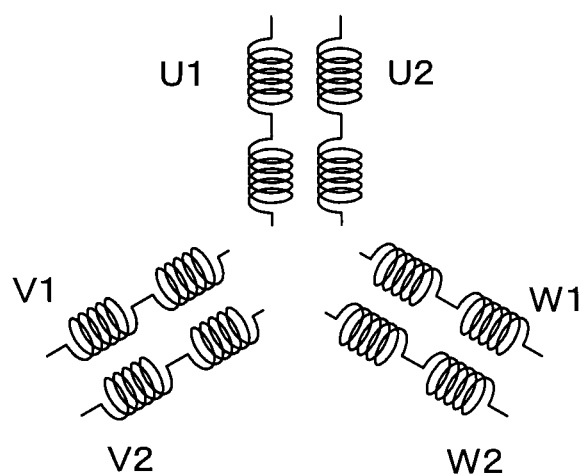

FIG.7

| | SECOND COMPARATIVE EXAMPLE | | THIRD EMBODIMENT | |
|---|---|---|---|---|
| | MEASUREMENT PORTION | NON-MEASUREMENT PORTION | MEASUREMENT PORTION | NON-MEASUREMENT PORTION |
| FIRST | U1U2-V1V2 | W1W2 CORE | V1V2W1W2-U1U2 CORE | — |
| SECOND | V1V2-W1W2 | U1U2 CORE | W1W2U1U2-V1V2 CORE | — |
| THIRD | W1W2-U1U2 | V1V2 CORE | U1V1W1-U2V2W2 CORE | — |
| FOURTH | U1-U2 | V1V2 W1W2 CORE | | |
| FIFTH | V1-V2 | W1W2 U1U2 CORE | | |
| SIXTH | W1-W2 | U1U2 V1V2 CORE | | |
| SEVENTH | U1U2V1V2W1W2-CORE | — | | |

INSULATION TESTING APPARATUS AND METHOD OF THE SAME

CROSS-REFERENCE TO RELATED APPLICATION

This application is based on and claims the benefit of priority from earlier Japanese Patent Application No. 2019-071458 filed Apr. 3, 2019 and No. 2020-056075 filed Mar. 26, 2020, the description of which is incorporated herein by reference.

BACKGROUND

Technical Field

The present disclosure relates to an insulation testing apparatus and the method of the same for testing an insulation state of a coating of the wire rod that forms a coil of a rotary electric machine.

Description of the Related Art

Conventionally, rotary electric machines used for motor generators mounted on electric vehicles are known. The manufacturing process of each rotary electric machine includes a manufacturing step of testing an insulation state of a coating of the wire rod forming the coil inserted into a slot.

SUMMARY

The present disclosure provides an insulation testing apparatus and a method of the same which are capable of improving the test accuracy.

As a first aspect, the present disclosure provides an insulation testing apparatus that tests an insulation state of each coating in a plurality of wire rods inserted into a slot included in a core of a rotary electric machine, in a state before a U phase wire rod, a V phase wire rod and a W phase wire rod are connected. The insulation testing apparatus includes: a power unit; a switching unit; a discharge measurement unit; an insulation determination unit; and a control unit.

BRIEF DESCRIPTION OF THE DRAWINGS

In the Accompanying drawings:

FIG. 4 is a table in which an insulation test method according to a first comparative example and an insulation test method according to the first embodiment are compared;

FIG. 5 is a table in which an insulation test method according to a first comparative example and an insulation test method according to the second embodiment are compared;

FIG. 6 is a schematic diagram showing a state where the wire rods of the respective phases of the rotary electric machine, which are objects for the insulation test of a third embodiment, are connected in parallel;

FIG. 7 is a table in which an insulation test method according to a second comparative example and an insulation test method according to the third embodiment are compared;

DESCRIPTION OF THE PREFERRED EMBODIMENTS

As an example of conventional insulation testing apparatus, Japanese Patent Application Laid-Open Publication Number 2005-257549 discloses an insulation testing apparatus that performs an insulation test between U, V, W phases before the wire rods of respective phases inserted into slots of the stator core are mutually connected at a neutral point. The insulation test between phases (i.e. inter-phase insulation test) refers to an insulation test between a wire rod of a predetermined phase and a wire rod of another phase. Specifically, for example, for the insulation test between the U phase wire rod and the V phase wire rod, the U phase wire rod is connected to one probe of the insulation testing apparatus, and the V phase wire rod is connected to the other probe of the insulation testing apparatus, then the insulation testing apparatus applies AC voltage between the U phase wire rod and the V phase wire rod, thereby causing a partial discharge to measure the discharged quantity of electric charge.

However, according to the insulation testing apparatus of the above-described patent literature, when conducting an interphase insulation test, a portion where the insulation test is being conducted (hereinafter referred to as measurement portion) and a portion where the insulation test is not conducted (hereinafter referred to as non-measurement portion) are produced. Hence, in the case where a floating potential is present at a non-measurement portion, discharge is induced from the non-measurement portion to the measurement portion such that occurrence of discharge is likely to increase. For example, when the insulation test is conducted between the U phase wire rod and the V phase wire rod, probe is not connected to the W phase wire rod and the stator core. Hence, in this case, an erroneous detection may occur in which a wire rod that satisfies a predetermined quality regulation is determined as a wire rod which does not satisfy the quality regulation. Accordingly, accuracy of the insulation test may be degraded.

Hereinafter, with reference to the drawings, embodiments of the present disclosure will be described. In the following embodiments, the same reference signs are designated to elements having the same or substantially the same functions, and the description will be omitted or will be described as needed.

First Embodiment

Figure 1:
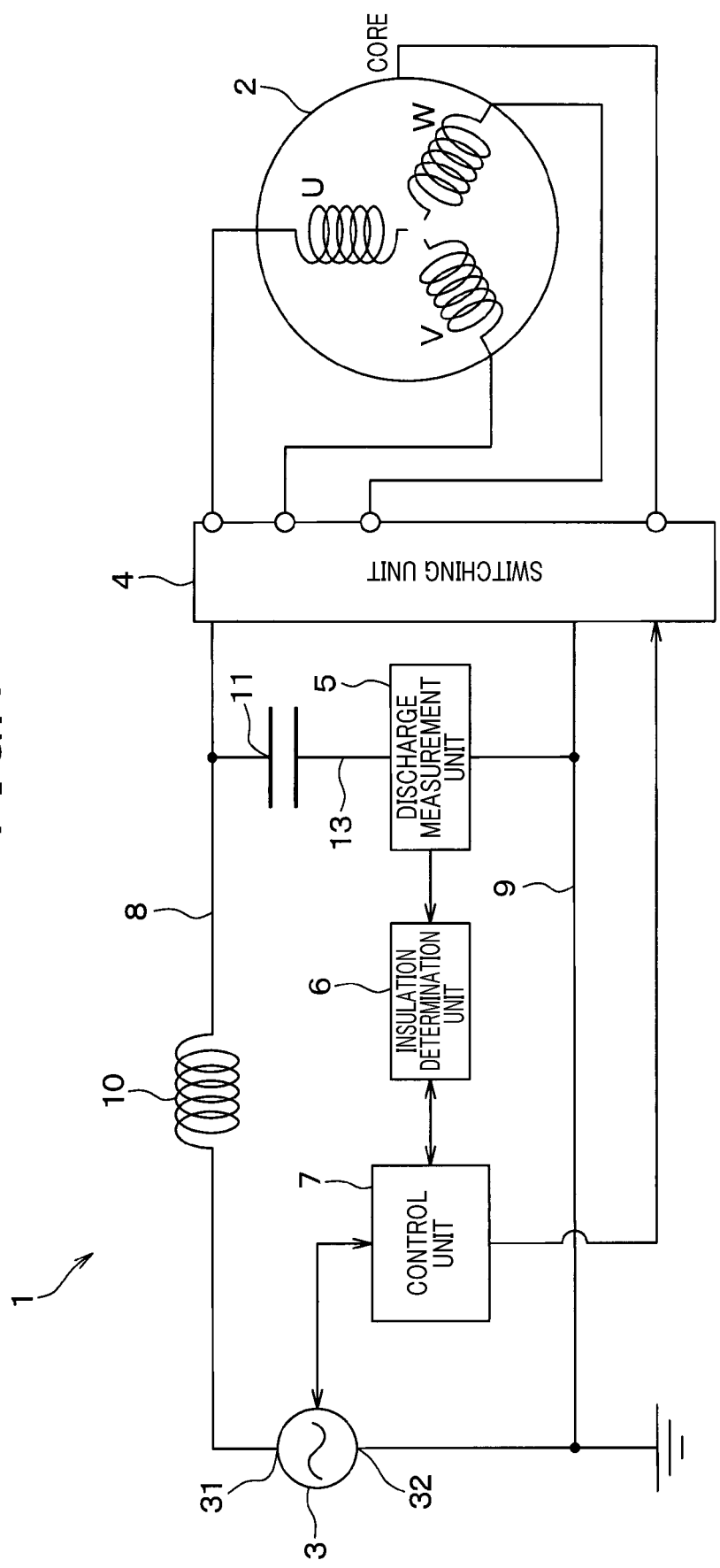
FIG. 1 is an overall diagram showing a circuit configuration of an insulation testing apparatus according to a first embodiment of the present disclosure.
Figure 2:
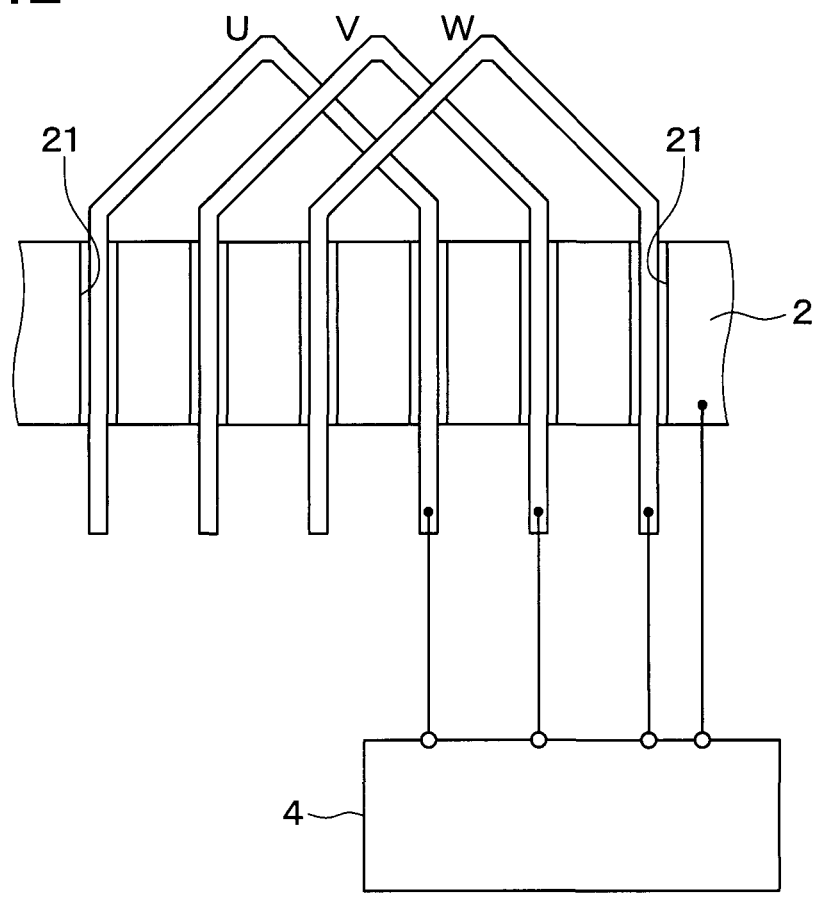
FIG. 2 is a schematic diagram showing a part of a plurality of wire rods inserted into slots of the stator core.
Figure 3:
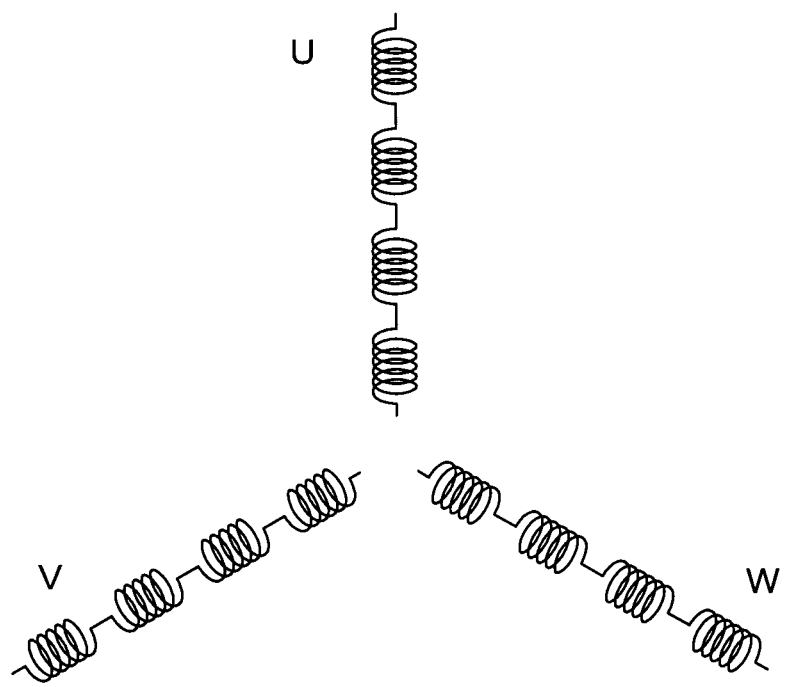
FIG. 3 is a schematic diagram showing a state where the wire rods of respective phases of a rotary electric machine.

With reference to the drawings, a first embodiment will be described. As shown in FIGS. 1 to 3, an insulation testing apparatus 1 according to the first embodiment is configured to test an insulation state of each coating of a plurality of wire rods inserted to a slot 21 included in the stator core 2 of a rotary electric machine which is not shown. Note that the rotary electric machine is used for, for example, a motor generator mounted on an electric vehicle.

As shown in FIG. 1, the insulation testing apparatus 1 is provided with a power unit 3, a switching unit 4, a discharge measurement unit 5, an insulation determination unit 6 and a control unit 7. The power unit 3 is configured of an AC power source. The power unit 3 includes a first terminal 31 and a second terminal 32. The first terminal 31 is connected to the switching unit 4 via a wiring 8 of one side and the second terminal 32 is connected to the switching unit 4 via a wiring 9 of the other side.

The switching unit 4 is electrically connected to respective U/V/W phase wire rods and the stator core 2. As shown in FIG. 2, the respective U/V/W wire rods are being inserted into the slot 21 included in the stator core 2. FIG. 2 schematically illustrates a part of the stator core 2, and a part of the plurality of wire rods which constitute the U/V/W phase wirings. Note that the wire rod is also referred to as a segment coil.

Also, as shown in FIG. 3, the wire rods of the U phase, the wire rods of the V phase and the wire rods of the W phase are each connected in series. Also, the U/V/W phase wire rods are in a state before the respective wire rods are connected to the neutral point.

As shown in FIG. 1, the switching unit 4 is capable of switching between electrical connected state and disconnected state between the wire rods of respective U, V, W phases and the stator core 2, and one wiring 8 connected to the first terminal 31 and the other wiring 9 connected to the second terminal 32.

A blocking coil 10 is provided in the wiring 8 that connects the first terminal 31 and the switching unit 4. The blocking coil 3 prevents a discharge pulse signal (higher harmonics) caused by a partial discharge produced in the wire rods or the stator core 2 from reverse-flowing towards the power unit 3. Further, a coupling capacitor 11 is provided in the wiring 13 connected in parallel to the power unit 3 and the switching unit 4, and the discharge pulse signal produced in the wire rods or the stator core 2 flows into this coupling capacitor 11.

The discharge measurement unit 5 is disposed to be in series with the coupling capacitor 11. The discharge measurement unit 5 is configured to measure an amount of discharge produced between a member electrically connected to the first terminal 31 via the switching unit 4 and a member electrically connected to the second terminal 32 via the switching unit 4, among the respective wire rods for U, V, W phases and the stator core 2. Specifically, the discharge measurement unit 5 detects small amount of current flowing through the coupling capacitor 11 when being partially discharged, and calculates a discharge quantity of electric charges based on the amount of the small current. Then, the discharge measurement unit 5 measures the number of discharges detected based on the discharge quantity for predetermined periods to be the amount of discharge.

According to the present embodiment, the discharge measurement unit 5 measures the amount of discharge based on the following two parameters. Specifically, the discharge measurement unit 5 is configured to detect occurrence of discharge when the discharge quantity of electric charge is larger than or equal to a predetermined amount and a frequency of movement of electric charges due to application of the AC voltage is larger than or equal to a predetermined frequency. Then, the discharge measurement unit 5 determines the number of discharges measured at predetermined periods to be the amount of discharge.

The insulation determination unit 6 determines, based on the amount of discharge measured by the discharge measurement unit 5, whether the coating of the wire rod satisfies a predetermined quality regulation. Specifically, the insulation determination unit 6 determines that the coating of the wire rod satisfies the predetermined quality regulation when an amount of discharge measured by the discharge measurement unit 5 is smaller than a predetermined threshold at a time when a certain period has elapsed from a time when the discharge started. On the other hand, when the amount of discharge measured by the discharge measurement unit 5 is larger than the predetermined threshold at a time when a certain period has elapsed from a time when the discharge started, the insulation determination unit 6 satisfies the coating of the wore rod does not satisfy the predetermined quality regulation.

The information about the determination result of the insulation determination unit 6 is transmitted to the control unit 7. The control unit controls respective parts of the insulation testing apparatus 1. Specifically, the control unit 7 control the output voltage of the power unit 3. Also, the control unit 7 is capable of controlling an operation of the switching unit 4.

According to the present embodiment, the control unit 7 controls the operation of the switching unit 4 such that all of the wire rods for respective U, V, and W phases and the stator core 2 are electrically connected to the first terminal 31 or the second terminal 32. Also, the control unit 7 controls the operation of the switching unit 4 such that none of the wire rods of respective phases U, V and W nor the stator core 2 is insulated with both of the first terminal 31 and the second terminal 32.

Thus, the insulation testing apparatus 1 electrically connects all of the wire rods for the respective phases U, V, W and the stator core 2 to the first terminal 31 or the second terminal 32, whereby a floating potential can be removed. Hence, discharge is prevented from being led to a measurement portion where the insulation test is conducted from a non-measurement portion where no insulation test is conducted. Therefore, the insulation testing apparatus 1 prevents an over detection, in which a wire rod satisfying a predetermined quality regulation is erroneously determined as a wire rod dissatisfying the predetermined quality regulation, from occurring. As a result, an accuracy of the insulation test can be improved.

Further, the insulation testing apparatus 1 according to the first embodiment is able to simultaneously test a plurality of portions for an inter-phase insulation and an insulation with respect to the ground. Hence, compared to an ordinal insulation test method, the number of tests becomes less. Accordingly, time required for the insulation test can be shortened.

Hereinafter, with reference to FIG. 4, a method of insulation test using the insulation testing apparatus 1 according to the first embodiment will be described comparing with a method of the insulation test according to a first comparative example. Note that the first comparative example exemplifies an ordinal insulation test for wire rods in which wire rods are connected in series in the respective U, V, W phases. The order of the insulation test described in a table of FIG. 4 can be arbitrarily changed. The same applies to FIGS. 5 and 7 to which the second and third embodiments refer.

First, a method of insulation test according to the first comparative example will be described.

According to the first comparative example, insulation tests between phases are performed at the first to third test, and an insulation test with respect to the ground is performed at the fourth test. Specifically, the insulation test for U phase wire rods and V phase wire rods are performed at the first test. At the first insulation test, the switching unit operates so as to electrically connect between the first terminal 31 of the power unit 3 and the wire rods of the U phase, and between the second terminal 32 of the power unit 3 and the wire rods of the V phase. Then, the power unit 3 applies AC voltage between the U phase wire rods and the V phase wire rods, and an amount of discharge produced between U phase wire rods and V phase wire rods is measured by the discharge measurement unit 5.

Note that the W phase wire rods and the stator core 2 are non-measurement portion at the first insulation test. Hence, in the case where a floating potential is present in the non-measurement portion, discharge will be induced to the measurement portion from that non-measurement portion, thus increases occurrence of discharging. Therefore, according to the configuration of the first comparative example, an erroneous detection may occur in which a wire rod that satisfies a predetermined quality regulation is determined as a wire rod which does not satisfy the quality regulation. Accordingly, accuracy of the insulation test may be degraded.

Subsequently, an insulation test is performed for the wire rods of V phase and the wire rods of W phase at the second testing. Note that since the second and third tests only differs from the first test in that testing phases are different, the description thereof will be omitted.

In the fourth test, insulation test is performed between each of the wire rods of U, V, W phases and the stator core 2. With the fourth insulation test, the switching unit 4 electrically connects the first terminal 31 of the power unit 31 and the wire rods of respective phases U, V, W, and electrically connects the second terminal 32 of the power unit 3 and the stator core 2. Then, the power unit 3 applies AC voltage between the wire rods of the respective phases U, V, W phases and the stator core 2, and the discharge measurement unit 5 measures an amount of discharge generated between the respective wire rods in U, V, W phases and the stator core 2.

According to the first comparative example, in the case where it is determined that any one of coatings in the wire rods of U, V, W phases does not satisfy the predetermined quality regulation during the first to fourth insulation test, the product having the coating of the wire rod which fails the quality regulation is regarded as disposal product.

Next, a method of the insulation test according to the first embodiment will be described. According to the first embodiment, the insulation test between phases (i.e. inter-phase insulation test) and the insulation test with respect to the ground (i.e. ground insulation test) are simultaneously performed in the first and second tests, and the insulation test with respect to the ground is performed in the third test. Specifically, at the first test, the insulation tests are performed between the U phase wire rods, and V, W phase wire rods and stator core 2. In the first insulation test, the switching unit 4 electrically connects the first terminal 31 of the power unit 3 and the U phase wire rods, and electrically connects between the second terminal 32 of the power unit 3, and the V, W phases wire rods and stator core 2. Then, the power unit 3 applies AC voltage between the U phase wire rods, and the V, W phase wire rods and the stator core 2, and the discharge measurement unit 5 measures an amount of discharge generated between the U phase wire rods, and V, W phases wire rods and the stator core 2.

Next, at the second test, an insulation test is performed between the V phase wire rods, and the W, U phase wire rods and the stator core 2. In the second insulation test, the switching unit 4 electrically connects the first terminal of the power unit 3 and the V phase wire rods, and electrically connects between the second terminal 32 of the power unit 3, and the W, U phase wire rods and the stator core 2. Then, the power unit 3 applies AC voltage between the V phase wire rods, and the W, U phase wire rods and the stator core 2, and the discharge measurement unit 5 measures an amount of discharge generated between the V phase wire rods, and W, U phases wire rods and the stator core 2.

Finally, at the third test, an insulation test is performed for wire rods of respective U, V, W phases and the stator core 2. At the third insulation test, the switching unit 4 operates so as to electrically connect the first terminal 31 of the power unit 3 and the U, V, W phase wire rods, and electrically connect the second terminal 32 of the power unit 3 and the stator core 2. Then, the power unit 3 applies AC voltage between the U, V, W phases wire rods and the stator core 2, and the discharge measurement unit 5 measures an amount of discharge generated between the U, V, W phase wire rods, and the stator core 2.

According to the first embodiment, in the case where it is determined that any one of coatings in the wire rods of U, V, W phases does not satisfy the predetermined quality regulation during the first to third insulation test, the product having the coating of the wire rod which fails the quality regulation is regarded as disposal product.

Thus, since the method of the insulation test according to the first embodiment has the number of tests smaller than that of the first comparative example, a time required for the insulation test can be shortened. As a result, the number of insulation testing apparatuses can be reduced, that is, capital investment can be reduced.

Note that a connection state of the wirings in the first and second test according to the above-described first embodiment, a first series-connection measurement state. In other words, the first series-connection measurement state refers to a state where wire rods of any one of U, V, W phases and the first terminal 31 is electrically connected, and the wire rods of the other two phases and the stator core 2, and the second terminal 32 are electrically connected.

Further, the connection of wirings in the third test according to the first embodiment is referred to as a second series-connection measurement state. In other words, second series-connection measurement state refers to a state where all of the wire rods of U, V, W phases and the first terminal 31 are electrically connected, and the stator core 2 and the second terminal 32 are electrically connected. None of the first series-connection measurement state and the second-connection measurement state causes a non-measurement portion.

The insulation testing apparatus 1 and the method thereof according to the first embodiment described above has the following effects and advantages.

(1) According to the first embodiment, during the insulation test, the control unit 7 controls the switching unit 4 such that none of the respective U, V, W phases wire rods nor the stator core 2 is insulated with respect to both of the first terminal 31 and the second terminal 32. At this time, the control unit 7 controls the switching unit 4 such that the all of the respective U, V, W wire rods and the stator core 2 are electrically connected to the first terminal 31 or the second terminal 32. Thus, non-measurement portion can be removed when the insulation test is performed. Hence, according to the first embodiment, unlike the first comparative example, discharge is not induced from the non-measurement portion to the measurement portion. Therefore, the insulation testing apparatus 1 and the method thereof according to the first embodiment prevents over detection from occurring and improves the accuracy of the insulation test.

(2) According to the first embodiment, during the insulation test, the control unit 7 controls the switching unit 4 to produce the first series-connection measurement state and the second series-connection measurement state. Thus, the insulation testing apparatus 1 and the method thereof according to the first embodiment is able to reduce the number of tests compared to a regular testing method described as the comparative example. Accordingly, the insulation testing apparatus 1 and the method thereof according to the first embodiment removes a floating potential, thereby improving the accuracy of the insulation test and also shortening a time required for the insulation test.

Second Embodiment

Hereinafter, a second embodiment will be described. The second embodiment differs from the first embodiment in that the testing method of the insulation testing apparatus 1 is slightly modified from that of the first embodiment. Since other part of the method is the same as those in the first embodiment, only the different part will be described. Note that according to the second embodiment, the wire rods are series-connected in the respective U, V, W phases as similar to that of the first embodiment.

A method of the insulation test with the insulation testing apparatus 1 according to the second embodiment is shown in a table of FIG. 5. Note that since the insulation test method of the first comparative example described in the table of FIG. 5 is the same as that of the first embodiment, the explanation thereof will be omitted.

According to the second embodiment, an inter-phase insulation test and a ground insulation test are simultaneously performed at the first and second test. Specifically, the insulation test is performed for the wire rods of U, V, W phases and the stator core 2 at the first test. At the first insulation test, the switching unit 4 operates to electrically connect between the first terminal 31 of the power unit 3 and the wire rods of the V, W phases, and electrically connects between the second terminal of the power unit 3, and the U phase wire rods and the stator core 2. Then, the power unit 3 applies AC voltage between the wire rods of the V, W phases, and the wire rods of the U phase and the stator core 2, and an amount of discharge produced between wire rods of the V, W phases, and U phase wire rods and the stator core 2 is measured by the discharge measurement unit 5.

Next, at the second test, an insulation test between the W, U phases wire rods of, and the V phase wire rods and the stator core 2 is performed. At the second test, the switching unit 4 operates to electrically connect between the first terminal 31 of the power unit 3 and the wire rods of W, U phases, and electrically connect between the second terminal 32 of the power unit 3, and the V phase wire rods and the stator core 2. Then, the power unit 3 applies AC voltage between the wire rods of the W, U phases, and the wire rods of the V phase and the stator core 2, and an amount of discharge produced between wire rods of the W, U phases, and V phase wire rods and the stator core 2 is measured by the discharge measurement unit 5.

According to the second embodiment, at the first and second insulation tests, in the case where it is determined that any one of coatings in the wire rods of U, V, W phases does not satisfy the predetermined quality regulation, the product having the coating of the wire rod which fails the quality regulation is regarded as disposal product.

As described, according to the second embodiment, wire rods of any two phases among U, V, W phases and the first terminal 31 are electrically connected, and wire rods of the other one phase and the stator core 2 and the second terminal 32 are electrically connected. Thus, all of the wire rods of the U, V, W phases and the stator core 2 are electrically connected to the first terminal 31 or the second terminal 32, whereby a floating potential can be removed. Hence, the insulation testing apparatus 1 and the method thereof according to the second embodiment prevents an over detection from occurring and improves the accuracy of the insulation test.

Further, since the method of the insulation test according to the second embodiment has the number of tests smaller than that of the first comparative example, a time required for the insulation test can be shortened. Also, the number of tests in the insulation test method according to the second embodiment is less than that of the insulation test of the first embodiment.

Third Embodiment

Next, a third embodiment will be described. The third embodiment differs from the first embodiment in that the testing method of the insulation testing apparatus 1 is slightly modified from that of the first embodiment. Since other part of the method is the same as those in the first embodiment, only the different part will be described.

As shown in FIG. 6, according to the third embodiment, the wire rods are connected in parallel in each of U, V, W phases. In the following explanation, one series-connected wire rods in the parallel-connected wire rods of U phase is referred to as U1 wire rods, and the other series-connected wire rods is referred to as U2 wire rods. Similarly, one series-connected wire rods in the parallel-connected wire rods of V phase is referred to as V1 wire rods, and the other series-connected wire rods is referred to as V2 wire rods. Moreover, one series-connected wire rods in the parallel-connected wire rods of W phase is referred to as W1 wire rods, and the other series-connected wire rods is referred to as W2 wire rods.

With reference to FIG. 7, a comparison between the insulation test method of the insulation testing apparatus 1 according to the third embodiment and the insulation test method according to a second comparative example will be described. Note that the second comparative example exemplifies a regular method of the insulation test for wire rods in which each of the U phase wire rods, V phase wire rods and the W phase wire rods are parallel-connected.

First, a method of the insulation test according to the second comparative example will be described. In the second comparative example, an inter-phase insulation test is performed at the first to third test, and an insulation test for each phase is performed at the fourth to sixth tests, and an insulation test with respect to the ground is performed at the seventh test. Specifically, at the first test, an insulation test is performed for the U1 and U2 wire rods and the V1 and V2 wire rods. At the first insulation test, the switching unit 4 operates to electrically connect between the first terminal 31 of the power unit 3 and the U1 and U2 wire rods, and to electrically connect between the second terminal 32 of the power unit 3 and the V1, V2 wire rods. Then, the power unit 3 applies AC voltage between the U1 and U2 wire rods and the V1 and V2 wire rods, and an amount of discharge produced between U1, U2 wire rods, and V1, V2 wire rods is measured by the discharge measurement unit 5.

Note that W1, W2 wire rods and the stator core 2 are non-measurement portion at the first insulation test. Hence, in the case where a floating potential is present in the non-measurement portion, discharge is induced from the non-measurement portion to the measurement portion such that occurrence of discharge is likely to increase.

Subsequently, at the second time, an insulation test is performed between the V1, V2 wire rods and the W1, W2 wire rods. At the third time, an insulation test is performed for the W1, W2 wire rods and the U1, U2 wire rods. Note that since the insulation test at the second and third insulation test only differs from those in the first embodiment in that the phases U, V, W are different, the explanation thereof will be omitted.

At the fourth test, the insulation test is performed for the U1 wire rods and the U2 wire rods. At the fourth insulation test, the switching unit 4 operates to electrically connect between the first terminal 31 of the power unit 3 and the U1 wire rods, and to electrically connect between the second terminal 32 of the power unit 3 and the U2 wire rods. Then, the power unit 3 applies AC voltage between the U1 wire rods and the U2 wire rods, and an amount of discharge produced between the U1 wire rods and the U2 wire rods is measured by the discharge measurement unit 5. Note that the wire rods of V1, V2, W1, W2 phases and the stator core 2 are non-measurement portion at the fourth insulation test. Hence, in the case where a floating potential is present in the non-measurement portion, discharge is induced from the non-measurement portion to the measurement portion such that occurrence of discharge is likely to increase.

Subsequently, at the fifth test, an insulation test is performed for the V1 wire rods and V2 wire rods. At the sixth test, an insulation test for the W1 wire rods and the W2 wire rods. Note that since the fifth and sixth insulation tests only differs from the fourth insulation test in that phases U, V, W of the wire rods to be tested are different from each other, the explanation thereof will be omitted.

At the seventh test, an insulation test is performed for the wire rods of U, V, W phases and the stator core 2. At the seventh test, the switching unit operates to electrically connect between the first terminal 31 of the power unit 3, and the wire rods of U1, U2, V1, V2, W1 W2, and electrically connect between the second terminal 32 of the power unit 3 and the stator core 2. Then, the power unit 3 applies AC voltage between the U1, U2, V1, V2, W1, W2 wire rods, and the U2 wire rods, and an amount of discharge produced between the U1, U2, V1, V2, W1, W2 wire rods and the stator core 2 is measured by the discharge measurement unit 5.

According to the second comparative example, at the first to seventh insulation tests, in the case where it is determined that any one of coatings in the U1, U2, V1, V2, W1 W2 wire rods does not satisfy the predetermined quality regulation, the product having the coating of the wire rod which fails the quality regulation is regarded as disposal product.

Next, an insulation test method according to the third embodiment will be described. According to the third embodiment, the inter-phase insulation test and the ground insulation test are simultaneously performed in the first and second tests, and the each-phase insulation test and the ground insulation test are performed in the third test. Specifically, at the first test, an insulation test is performed between the V, W phase wire rods, and U phase wire rods and the stator core 2. At the first insulation test, the switching unit 4 operates to electrically connect between the first terminal 31 of the power unit 3 and the V1, V2, W1, W2 wire rods, and to electrically connect between the second terminal 32 of the power unit 3, and the U1, U2 wire rods and the stator core 2. Then, the power unit 3 applies AC voltage between the V1, V2, W1, W2 wire rods, and the U1 and U2 wire rods and the stator core 2, and an amount of discharge produced between V1, V2, W1, W2 wire rods, and U1, U2 wire rods and the stator core 2 is measured by the discharge measurement unit 5.

Next, at the second test, an insulation test between the W1, W2, U1, U2 wire rods, and the V1, V2 wire rods and the stator core 2 is performed. At the second test, the switching unit 4 operates to electrically connect between the first terminal 31 of the power unit 3 and the W1, W2, U1, U2 wire rods, and electrically connect between the second terminal 32 of the power unit 3, and the V1, V2 wire rods and the stator core 2. Then, the power unit 3 applies AC voltage between the W1, W2, U1, U2 wire rods, and the V1, V2 wire rods and the stator core 2, and an amount of discharge produced between W1, W2, U1, U2 wire rods, and V1, V2 wire rods and the stator core 2 is measured by the discharge measurement unit 5.

Lastly, at the third test, an insulation test is performed between the U1, V1, W1 wire rods and the U2, V2, W2 wire rods, the stator core 2. In the third insulation test, the switching unit 4 operates to electrically connect between the first terminal 31 of the power unit 3 and the U1, V1, W1 wire rods, and electrically connect between the second terminal 32 of the power unit 3, and the U2, V2, W2 wire rods, the stator core 2. Then, the power unit 3 applies AC voltage between the U1, V1, W1 wire rods, and the U2, V2, W2 wire rods, the stator core 2, and an amount of discharge produced between the U1, V1, W1 wire rods, and the U2, V2, W2 wire rods, the stator core 2 is measured by the discharge measurement unit 5.

According to the third embodiment, at the first to third insulation tests, in the case where it is determined that any one of coatings in the U1, U2, V1, V2, W1, W2 wire rods does not satisfy the predetermined quality regulation, the product having the coating of the wire rod which fails the quality regulation is regarded as disposal product.

Thus, since the method of the insulation test according to the third embodiment has the number of tests smaller than that of the second comparative example, a time required for the insulation test can be shortened.

It should be noted that connection state of the wirings in the first test and the second test according to the third embodiment are referred to as a first parallel connection measurement state. The first parallel connection measurement state refers to a state where wire rods connected in parallel in each of any two phases among the U phase, the V phase and the W phase and the first terminal 31 are electrically connected, and wire rods connected in parallel in the other phase, the stator core 2 and the second terminal 32 are electrically connected.

Further, the connection state of the wirings in the third test according to the third embodiment is referred to as a second parallel connection measurement state. In other words, the second parallel connection measurement state refers to a state where wire rods connected in parallel in some of the respective U/V/W phases and the first terminal 31 are electrically connected, and the other of the respective U/V/W phases, the stator core 2 and the second terminal 32 are electrically connected. Note that non-measurement portion is not produced in both of the first parallel connection measurement state and the second parallel connection measurement state.

According to the above-described third embodiment, during the insulation test, the control unit 7 controls the switching unit 4 to produce the first parallel connection measurement state and the second parallel connection measurement state. Thus, the insulation testing apparatus 1 and the method thereof according to the third embodiment is able to reduce the number of tests compared to a regular testing method described as the second comparative example. Accordingly, the insulation testing apparatus 1 and the method thereof according to the third embodiment removes a floating potential, thereby improving the accuracy of the insulation test and also shortening a time required for the insulation test.

Fourth Embodiment

Next, a fourth embodiment will be described. The fourth embodiment differs from the first embodiment or the like in that the configuration of the insulation testing apparatus 1 and the testing method thereof is slightly modified from that of the first embodiment. Since other part thereof are the same as those in the first embodiment, only the different part will be described.

Figure 8:
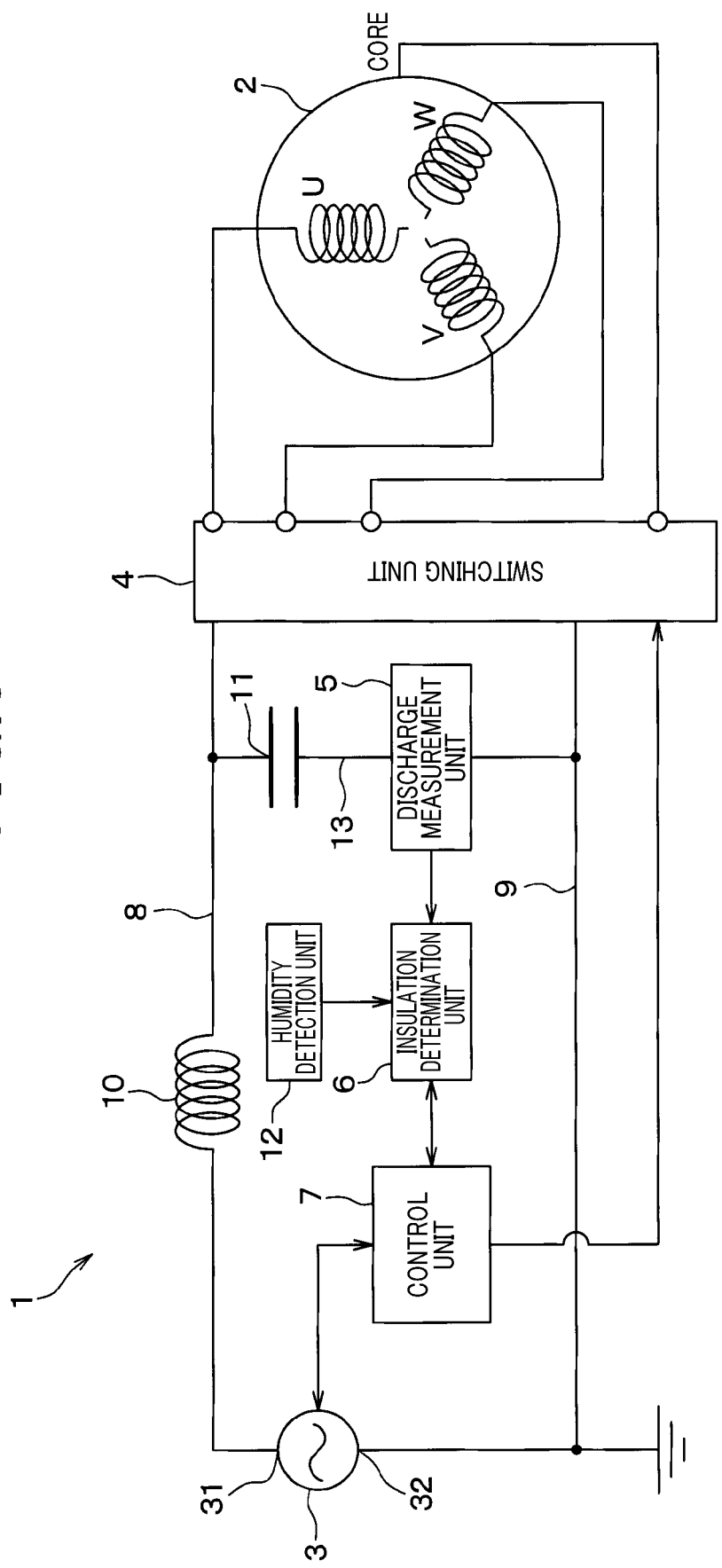
FIG. 8 is an overall diagram showing a circuit configuration of an insulation testing apparatus according to a fourth embodiment of the present disclosure.

As shown in FIG. 8, an insulation testing apparatus 1 according to the fourth embodiment is provided with a humidity detection unit 12. The humidity detection unit 12 detects an ambient humidity around the wire rods of U phase, V phase and W phase, and the stator core 2, or a moisture absorption of the coatings of the wire rods. In the following description, the ambient humidity or the moisture absorption may be merely referred to as humidity. Moreover, the humidity detected by the humidity detection unit 12 may be merely referred to as detection humidity.

The insulation testing apparatus 1 of the fourth embodiment sets, based on the detection humidity, a determination period from a time when the power unit 3 starts to apply voltage to the wire rods to a time when the insulation determination unit 6 determines whether the insulation state of the wire rods passes or fails. The determination period is set such that a determination period where the detection humidity is higher than a predetermined value, is set to be longer than a determination period where the detection humidity is lower than the predetermined value. Note that the predetermined value is set in accordance with an experiment result or the like, for example, to be within a range from 40% to 60%.

Figure 9:
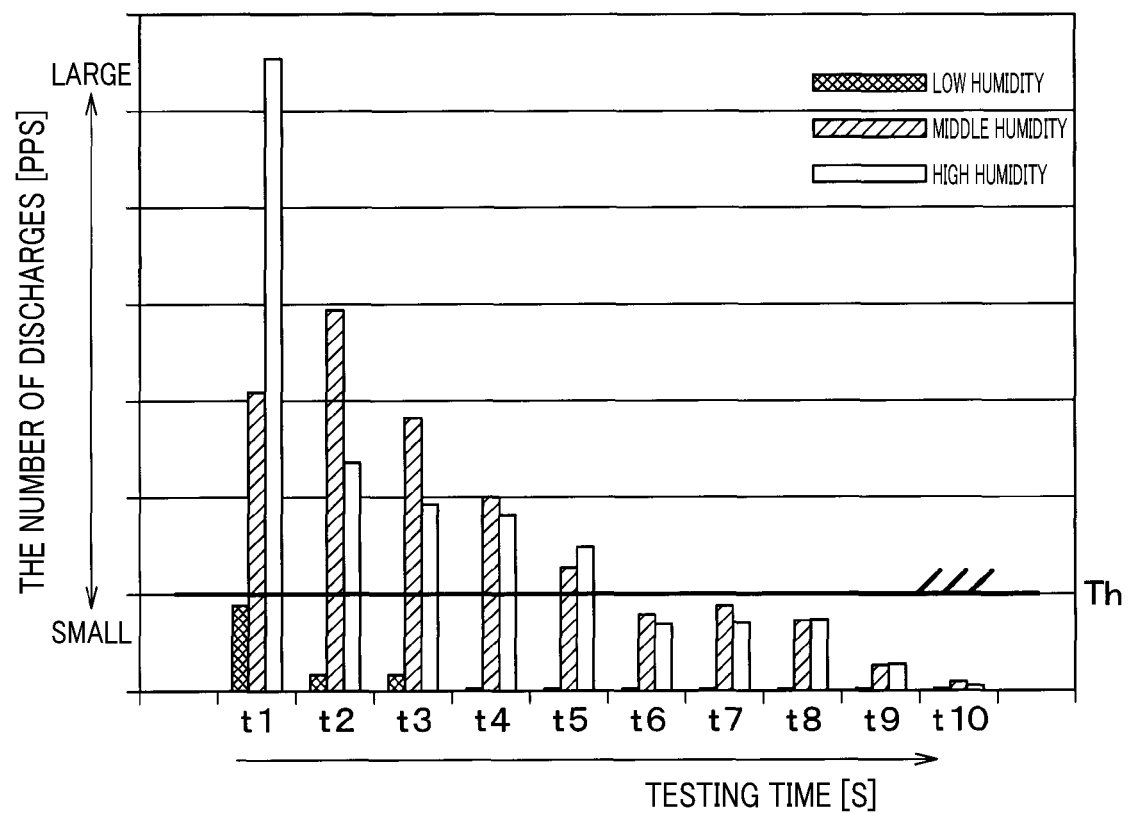
FIG. 9 is a graph showing an experiment result in which a change in the number of discharges caused by influence of humidity is shown.

Here, with reference to a graph shown in FIG. 9, a significance of changing the determination period based on the detection humidity will be described. FIG. 9 is an experiment result showing a change in the number of discharges due to an influence of the humidity.

The vertical axis of FIG. 9 shows the number of discharges. The number of discharges is equivalent to an amount of the discharge. In other words, assuming that the discharge is an event where the discharge quantity of electric charge is larger than or equal to a predetermined amount and a frequency of movement of electric charges due to application of the AC voltage is larger than or equal to a predetermined frequency, the number of discharges is defined as a measured number of discharge events at predetermined periods. The vertical axis of FIG. 9 shows a time elapsed from a time when the power unit 3 applied the voltage to the wire rods. Note that in the experiment, the voltage to be applied to the wire rods by the power unit 3 is not changed based on the humidity.

In FIG. 9, a change in the number of discharges when the humidity detection unit 12 detects a low detection humidity is shown with a bar chart with a cross hatching. Moreover, a change in the number of discharges when the humidity detection unit 12 detects a middle detection humidity is shown with a bar chart with a cross hatching. A change in the number of discharges when the humidity detection unit 12 detects a high detection humidity is shown with an outlined bar chart.

As shown in the bar chart with a cross hatching, in the case of the low humidity, the number of discharges is around a predetermined value at time t1. After the time t2, the number of discharges shows very small. Note that the predetermined value is set considering a lifetime duration of the rotary electric machine.

As shown in the bar chart with hatching and the outlined bar chart, in the case of high humidity and middle humidity, the number of discharges exceeds the predetermined value in a period from a time when the power unit start to apply voltage to a time t5. After time t6, the number of discharges is below the predetermined value, and the number of discharges shows very small at time t10.

As shown in the bar chart with the cross hatching in FIG. 9, in the case where the humidity is low, a period is short during a time when the discharge starts to a time when the number of discharges becomes small. However, as shown the bar chart with the cross hatching and the outlined bar chart, in the case where the humidity is high, a period is long during a time when the discharge starts to a time when the number of discharges becomes small. In this respect, according to the fourth embodiment, the determination period when the humidity is higher than the predetermined value is set to be longer than the determination period when the humidity is lower than the predetermined value. Thus, in the case where the humidity is higher than the predetermined value, the number of discharges measured by the discharge measurement unit 5 converges with time. Hence, the insulation testing apparatus 1 and the method thereof is able to avoid over detection and to improve the accuracy of the insulation test, without being influenced by the humidity. On the other hand, in the case where the humidity is lower than the predetermined value, the determination period is set to be shorter, whereby the time required for the insulation test can be shortened.

Other Embodiment

The present disclosure is not limited to the above-described embodiments but may be modified in various manners within a scope of the claims. Also, the above-described respective embodiments are not mutually unrelated, hence, may be appropriately combined excluding a case where combination is apparently impossible. Moreover, in the respective embodiments, elements that constitute each embodiment are not necessarily required, except a case where elements are specified as necessary or a case where elements are considered as theoretically necessary.

Further, in the case where numeric values such as the number of elements, values, quantity, range or the like are mentioned in the embodiments, it is not limited to those numeric values except a case where the numeric values are specified as necessary or a case where it is theoretically limited to specific numbers. Furthermore, in the respective embodiments, when describing shape of the elements or positional relationship therebetween, the shape or the positional relationship is not specifically limited unless otherwise specified or except a case where shape or the positional relationship is theoretically limited.

(1) According to the above-described embodiments, the insulation testing apparatus 1 is configured to test the insulation state of the coatings of the wire rods provided in the stator core 2 as an armature included in the rotary electric machine. However, it is not limited thereto. The insulation testing apparatus 1 may be configured to test the insulation state of the coatings of the wire rods provided in a rotor core as an armature included in the rotary electric machine.

(2) According to the above-described first embodiment, an insulation test is performed in a state where a plurality of wire rods constituting the U phase, a plurality of wire rods constituting the V phase and a plurality of wire rods constituting the W phase are each connected in series, and before being connected to the neutral point. However, it is not limited thereto. The insulation test may be performed in a state before the plurality of wire rods constituting the U phase, the plurality of wire rods constituting the V phase and the plurality of wire rods constituting the W phase are each connected in series, and before being connected to the neutral point.

(3) According to the above-described third embodiment, for the U phase wire rods, the V phase wire rods, and the W phase wire rods, each two wire rods in the respective phases are connected in parallel. However, it is not limited thereto. For the wire rods in the respective phases, multiple parallel connection such as three parallel connection or four parallel connection can be used.

(4) According to the above-described embodiments, a Y-connection is used for the wire rods. However, it is not limited thereto. For the wire rods, various connections such as ă-connection, ă-Y connection, Y-ă connection, ă-ă connection, and Y-Y connection may be used.

(5) According to the above-described fourth embodiment, the determination period when the detection humidity is higher than the detection humidity is set to be longer than the determination period when the detection humidity is lower than the detection humidity. However, it is not limited thereto. The application voltage may be set such that an application voltage when the detection humidity is higher than the predetermined value is set to be lower than an application voltage when the detection humidity is lower than the predetermined value.

CONCLUSION

An insulation testing apparatus according to the present disclosure is described.

As a first aspect, the present disclosure provides an insulation testing apparatus that tests an insulation state of each coating in a plurality of wire rods inserted into a slot included in a core of a rotary electric machine, in a state before a U phase wire rod, a V phase wire rod and a W phase wire rod are connected. The insulation testing apparatus includes: a power unit; a switching unit; a discharge measurement unit; an insulation determination unit; and a control unit.

The power unit includes a first terminal and a second terminal. The switching unit switches between an electrical connected state and an electrical disconnected state between the wire rods of respective U, V, W phases and the core, and the first terminal and the second terminal. The discharge measurement unit measures an amount of discharge produced between a first member electrically connected to the first terminal and a second member electrically connected to the second terminal, the first member being selected from among the wire rods of respective U, V, W phases and the core, and the second member being selected from among the wire rods of respective U, V, W phases and the core. The insulation determination unit determines, based on the amount of discharge measured by the discharge measurement unit, whether the coating of the wire rods satisfies a predetermined quality regulation. The control unit controls the switching unit such that all of the wire rods of the respective U, V, and W phases and the core are electrically connected to the first terminal or the second terminal, while controlling the switching unit such that none of the wire rods of respective U, V, W phases nor the core is insulated with both of the first terminal and the second terminal.

Thus, all of the wire rods for the respective phases U, V, W and the stator core 2 are electrically connected to the first terminal or the second terminal, whereby a floating potential can be removed. Hence, discharge is prevented from being led to a measurement portion where the insulation test is conducted from a non-measurement portion where no insulation test is conducted. Therefore, the insulation testing apparatus prevents an over detection, in which a wire rod satisfying a predetermined quality regulation is erroneously determined as a wire rod dissatisfying the predetermined quality regulation, from occurring. As a result, an accuracy of the insulation test can be improved. Note that the amount of discharge refers to the number of discharges measured for predetermined periods based on the discharge quantity detected by the discharge measurement unit. The wire rods inserted into the slots of an armature (i.e. stator core or rotor core) are referred to as segment coils.

The insulation test is sometimes performed under a condition where the ambient humidity or the moisture absorption (hereinafter, they may be simply referred to as humidity) is high. In this case, a continuous discharge tends to occur, where a discharge continuously occurs between a member among the U, V, W phases wire rods and the core electrically connected to the first terminal and a member among the U, V, W phases wire rods and the core electrically connected to the second terminal. The reason why this phenomenon occurs is that since the air or the coatings contains a large amount of moisture, ionization is likely to occur in gas atoms, whereby electron avalanche tends to continuously occur. Hence, as a countermeasure in the insulation test, partial discharge inception voltage (i.e. PDIV) is controlled to decrease at a constant ratio with respect to a humidity increase ratio. However, even with that countermeasure, the continuous discharge is likely to occur if the humidity exceeds a predetermined value and causes frequent over detections thereby degrading the accuracy of the insulation test.

In this respect, as a sixth aspect, the present disclosure provides an insulation testing apparatus that tests an insulation state of each coating in a plurality of wire rods inserted into a slot included in a core of a rotary electric machine, in a state before a U phase wire rod, a V phase wire rod and a W phase wire rod are connected. The insulation testing apparatus includes: a power unit; a switching unit; a discharge measurement unit; an insulation determination unit; and a humidity detection unit.

The power unit includes a first terminal and a second terminal. The switching unit switches between an electrical connected state and an electrical disconnected state between the wire rods of respective U, V, W phases and the core, and the first terminal and the second terminal. The discharge measurement unit measures an amount of discharge produced between a first member electrically connected to the first terminal and a second member electrically connected to the second terminal, the first member being selected from among the wire rods of respective U, V, W phases and the core, and the second member being selected from among the wire rods of respective U, V, W phases and the core. The insulation determination unit determines, based on the amount of discharge measured by the discharge measurement unit, whether the coating of the wire rods satisfies a predetermined quality regulation. The humidity detection unit detects an ambient humidity around the wire rods of respective U, V, W phases and the core, or a moisture absorption of coatings of the wire rods. Further, the insulation testing apparatus is configured to set a determination period from a time when the power unit starts to apply voltage to the wire rods to a time when the insulation determination unit determines whether the insulation state of the wire rods passes or fails, such that the determination period where the ambient humidity or the moisture absorption is higher than a predetermined value, is set to be longer than the determination period where the ambient humidity or the moisture absorption is lower than the predetermined value.

Thus, in the case where the humidity is higher than the predetermined value, the determination period is set to be longer, whereby the number of discharges measured by the discharge measurement unit converges with time. Hence, the insulation testing apparatus 1 and the method thereof is able to avoid over detection and to improve the accuracy of the insulation test, without being influenced by the humidity. On the other hand, in the case where the humidity is lower than the predetermined value, the determination period is set to be shorter, whereby the time required for the insulation test can be shortened.

A seventh aspect of the present disclosure is an insulation testing method for testing an insulation state of each coating in a plurality of wire rods inserted into a slot included in a core of a rotary electric machine, in a state before a U phase wire rod, a V phase wire rod and a W phase wire rod are connected. The method produces a state where all of the wire rods of respective U, V, and W phases and the core are electrically connected to a first terminal or a second terminal of a power unit, while producing a state where none of the wire rods of respective U, V, W phases nor the core is insulated with both of the first terminal and the second terminal. Then the method applies voltage to the wire rods of respective U, V, W phases and the core from the power unit, and measures an amount of discharge produced between a first member electrically connected to the first terminal and a second member electrically connected to the second terminal, the first member being selected from among the wire rods of respective U, V, W phases and the core, and the second member being selected from among the wire rods of respective U, V, W phases and the core.

According to the insulation testing method, similar to the first aspect, a floating potential is removed, thereby preventing an over detection from occurring and improving the accuracy of the insulation testing.

An eighth aspect of the present disclosure is an insulation testing method for testing an insulation state of each coating in a plurality of wire rods inserted into a slot included in a core of a rotary electric machine, in a state before a U phase wire rod, a V phase wire rod and a W phase wire rod are connected.

The method produces a state where the wire rods of respective U, V, W phases and the core are electrically connected to a first terminal or a second terminal of a power unit, detects an ambient humidity around the wire rods of respective U, V, W phases and the core, or a moisture absorption of coatings of the wire rods, and sets a determination period from a time when the power unit starts to apply voltage to the wire rods to a time when the insulation determination unit determines whether the insulation state of the wire rods passes or fails, such that the determination period where the ambient humidity or the moisture absorption is higher than a predetermined value, is set to be longer than the determination period where the ambient humidity or the moisture absorption is lower than the predetermined value.

Then, the method measures an amount of discharge produced between a first member electrically connected to the first terminal and a second member electrically connected to the second terminal, the first member being selected from among the wire rods of respective U, V, W phases and the core, and the second member being selected from among the wire rods of respective U, V, W phases and the core.

According to the insulation testing method, similar to the sixth aspect, without being influenced by the humidity, over detection is prevented from occurring, and the accuracy of the insulation testing can be improved. On the other hand, in the case where the humidity is lower than the predetermined value, the determination period is set to be shorter, whereby the time required for the insulation test can be shortened.

What is claimed is:

1. An insulation testing apparatus that tests an insulation state of each coating in a plurality of wire rods inserted into a slot included in a core of a rotary electric machine, in a state before a U phase wire rod, a V phase wire rod and a W phase wire rod are connected, the insulation testing apparatus comprising:
    a power unit having a first terminal and a second terminal;
    a switching unit that switches between an electrical connected state and an electrical disconnected state between the wire rods of respective U, V, and W phases and the core, and the first terminal and the second terminal, when neutral points of respective phase windings U, V, and W are not electrically connected;
    a discharge measurement unit that measures an amount of discharge produced between a first member electrically connected to the first terminal and a second member electrically connected to the second terminal, the first member being selected from among the wire rods of the respective U, V, and W phases and the core, and the second member being selected from among the wire rods of the respective U, V, and W phases and the core;
    an insulation determination unit determines, based on the amount of discharge measured by the discharge measurement unit, whether the coating of the wire rods satisfies a predetermined quality regulation; and
    a control unit that controls the switching unit such that all of the wire rods of the respective U, V, and W phases and the core are electrically connected to the first terminal or the second terminal, while controlling the switching unit such that none of the wire rods of the respective U, V, and W phases nor the core is insulated with both of the first terminal and the second terminal, and the neutral points of the respective phase windings U, V, and W are not electrically connected, wherein
    the control unit is configured to control the switching unit such that wire rods of any two phases among the U, V, and W phases and the first terminal are electrically connected, a wire rod of the other phase among the U, V, and W phases and the core and the second terminal are electrically connected, and the neutral points of the respective phase windings U, V, and W are not electrically connected.

2. The insulation testing apparatus according to claim 1, wherein
    the U phase wire rods, the V phase wire rods and the W phase wire rods are each connected in parallel, wire rods connected in parallel in each phase being composed of a first wire rod and a second wire rod; and the control unit is configured to control the switching unit to produce a first parallel connection measurement state where wire rods connected in parallel in each of any two phases among the U phase, the V phase and the W phase and the first terminal are electrically connected, and wire rods connected in parallel in the other phase, the core and the second terminal are electrically connected, and a second parallel connection measurement state where first wire rods of the respective U, V, and W phases and the first terminal are electrically connected, and second wire rods of the respective U, V, and W phases, the core and the second terminal are electrically connected.

3. The insulation testing apparatus according to claim 1, wherein the U phase wire rods, the V phase wire rods and the W phase wire rods are each connected in series; and the control unit is configured to control the switching unit to produce a first series-connection measurement state where wire rods in any one of the U, V, and W phases and the first terminal is electrically connected, and the wire rods of the other two phases and the core, and the second terminal are electrically connected, and a second series-connection measurement state where all of the wire rods of U, V, and W phases and the first terminal are electrically connected, and the core and the second terminal are electrically connected.

4. The insulation testing apparatus according to claim 1, wherein the insulation testing apparatus further comprising a humidity detection unit that detects an ambient humidity around the wire rods of the respective U, V, and W phases and the core, or a moisture absorption of coatings of the wire rods; and a determination period from a time when the power unit starts to apply voltage to the wire rods to a time when the insulation determination unit determines whether the insulation state of the wire rods passes or fails is set such that the determination period where the ambient humidity or the moisture absorption is higher than a predetermined value, is set to be longer than the determination period where the ambient humidity or the moisture absorption is lower than the predetermined value.

5. An insulation testing apparatus that tests an insulation state of each coating in a plurality of wire rods inserted into a slot included in a core of a rotary electric machine, in a state before a U phase wire rod, a V phase wire rod and a W phase wire rod are connected, the insulation testing apparatus comprising:

a power unit having a first terminal and a second terminal;

a switching unit that switches between an electrical connected state and an electrical disconnected state between the wire rods of respective U, V, and W phases and the core, and the first terminal and the second terminal, when neutral points of respective phase windings U, V, and W are not electrically connected;

a discharge measurement unit that measures an amount of discharge produced between a first member electrically connected to the first terminal and a second member electrically connected to the second terminal, the first member being selected from among the wire rods of the respective U, V, and W phases and the core, and the second member being selected from among the wire rods of the respective U, V, and W phases and the core, wherein the switching unit switches such that wire rods of any two phases among the U, V, and W phases and the first terminal are electrically connected, a wire rod of the other phase among the U, V, and W phases and the core and the second terminal are electrically connected, and the neutral points of the respective phase windings U, V, and W are not electrically connected; and an insulation determination unit determines, based on the amount of discharge measured by the discharge measurement unit, whether the coating of the wire rods satisfies a predetermined quality regulation; and a humidity detection unit that detects an ambient humidity around the wire rods of the respective U, V, and W phases and the core, or moisture absorption of coatings of the wire rods, wherein a determination period from a time when the power unit starts to apply voltage to the wire rods to a time when the insulation determination unit determines whether the insulation state of the wire rods passes or fails is set such that the determination period where the ambient humidity or the moisture absorption is higher than a predetermined value, is set to be longer than the determination period where the ambient humidity or the moisture absorption is lower than the predetermined value.

6. An insulation testing method for testing an insulation state of each coating in a plurality of wire rods inserted into a slot included in a core of a rotary electric machine, in a state before a U phase wire rod, a V phase wire rod and a W phase wire rod are connected, the method comprising:

producing a state where all of the wire rods of respective U, V, and W phases and the core are electrically connected to a first terminal or a second terminal of a power unit, while producing a state where none of the wire rods of the respective U, V, and W phases nor the core is insulated with both of the first terminal and the second terminal, and when neutral points of respective phase windings U, V, and W are not electrically connected;

applying voltage to the wire rods of the respective U, V, and W phases and the core from the power unit;

measuring an amount of discharge produced between a first member electrically connected to the first terminal and a second member electrically connected to the second terminal, the first member being selected from among the wire rods of the respective U, V, and W phases and the core, and the second member being selected from among the wire rods of the respective U, V, and W phases and the core; and controlling switching such that wire rods of any two phases among the U, V, and W phases and the first terminal are electrically connected, a wire rod of the other phase among the U, V, and W phases and the core and the second terminal are electrically connected, and the neutral points of the respective phase windings U, V, and W are not electrically connected.

7. An insulation testing method for testing an insulation state of each coating in a plurality of wire rods inserted into a slot included in a core of a rotary electric machine, in a state before a U phase wire rod, a V phase wire rod and a W phase wire rod are connected, the method comprising:

producing a state where the wire rods of the respective U, V, and W phases and the core are electrically connected to a first terminal or a second terminal of a power unit, when neutral points of respective phase windings U, V, and W are not electrically connected;

detecting an ambient humidity around the wire rods of the respective U, V, and W phases and the core, or moisture absorption of coatings of the wire rods;

setting a determination period from a time when the power unit starts to apply voltage to the wire rods to a time when an insulation determination unit determines whether the insulation state of the wire rods passes or fails insulation state testing, such that the determination period where the ambient humidity or the moisture absorption is higher than a predetermined value, is set to be longer than the determination period where the ambient humidity or the moisture absorption is lower than the predetermined value;

measuring an amount of discharge produced between a first member electrically connected to the first terminal and a second member electrically connected to the second terminal, the first member being selected from among the wire rods of the respective U, V, and W phases and the core, and the second member being selected from among the wire rods of the respective U, V, and W phases and the core; and controlling switching such that wire rods of any two phases among the U, V, and W phases and the first terminal are electrically connected, a wire rod of the other phase among the U, V, and W phases and the core and the second terminal are electrically connected, and the neutral points of the respective phase windings U, V, and W are not electrically connected.

\* \* \* \* \*